US006261969B1

(12) United States Patent
Matsuno et al.

(10) Patent No.: US 6,261,969 B1
(45) Date of Patent: Jul. 17, 2001

(54) METHOD OF MANUFACTURING SEMICONDUCTOR APPARATUS AND APPARATUS THEREOF

(75) Inventors: Yoshinori Matsuno; Hiroaki Morikawa, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/777,380

(22) Filed: Dec. 27, 1996

(30) Foreign Application Priority Data

Mar. 18, 1996 (JP) .................................... 8-061520

(51) Int. Cl.[7] ...................... H01L 21/302; H01L 21/461; C09K 13/00; C09K 13/04
(52) U.S. Cl. .......................... 438/745; 438/753; 438/756; 252/79.1; 252/79.2; 252/79.3; 252/79.4
(58) Field of Search ................... 438/745, 753, 438/756; 252/79.1, 79.2, 79.3, 79.4

(56) References Cited

U.S. PATENT DOCUMENTS

| 3,888,708 | * | 6/1975 | Wise et al. ............................ 438/753 |
| 3,977,925 | * | 8/1976 | Schwabe ............................... 438/424 |
| 4,294,651 | * | 10/1981 | Ohmura ............................... 438/750 |
| 4,795,528 | * | 1/1989 | Ohmi et al. ........................... 252/79.3 |
| 4,911,783 | * | 3/1990 | Vorboril ............................... 438/750 |
| 5,431,777 | * | 7/1995 | Austin et al. .......................... 438/753 |
| 5,484,748 | * | 1/1996 | Suzuki et al. ......................... 438/753 |
| 5,645,737 | * | 7/1997 | Robinson et al. ..................... 438/756 |
| 5,695,661 | * | 12/1997 | Ramussen et al. ................... 438/756 |
| 5,716,535 | * | 2/1998 | Lee et al. ............................. 438/756 |

FOREIGN PATENT DOCUMENTS

| 6-162452 | * | 7/1994 | (JP) . |
| 8 032068 | * | 7/1994 | (JP) . |
| 8-032096 | * | 2/1996 | (JP) . |

OTHER PUBLICATIONS

1994 IEEE First World Conference on Photovoltaic Energy Conversion, vol. II, Dec. 5–9, 1994.
Technical Digest, 7th International Photovoltaic Science and Engineering Conference, No. 22–26, 1993, Japan.
"Basic Study on Fabrication of GaAs Thin–film Solar Cells by Epitaxial Lift–off Technique" Junko Minemura et al, 1995.
S. Wolf and R. N. Tauber, Silicon Processing; for the VLSI Era vol. 1–Process Technology, pp. 529–534, Jul. 14, 1994.*

* cited by examiner

*Primary Examiner*—Benjamin L. Utech
*Assistant Examiner*—Lynette T. Umez-Eronini
(74) *Attorney, Agent, or Firm*—Sughrue, Mion, Zinn, Macpeak & Seas, PLLC

(57) ABSTRACT

The method of manufacturing a semiconductor apparatus can solve problems in that a semiconductor film is not separated completely from a substrate and a great quantity of etchant is required. Ammonium fluoride is added to a hydrofluoric acid solution, so as to improve the etching rate and promote separation of the semiconductor film from the substrate. A manufacturing apparatus according to the present invention is provided with a re-liquefying function capable of again liquefying vapor of hydrofluoric acid solution so as to use liquefied vapor as the etchant so that the etchant is saved.

21 Claims, 10 Drawing Sheets

METHOD OF MANUFACTURING SEMICONDUCTOR APPARATUS AND APPARATUS THEREOF

BACKGROUND OF THE INVENTION

1. Field of the Invention

The present invention relates to a method and an apparatus for manufacturing a semiconductor apparatus, and more particularly to a method of separating a semiconductor film and a substrate from each other.

2. Related Art

FIG. 10 shows a conventional method of manufacturing a semiconductor apparatus, and in particular, a method of separating a semiconductor film and a substrate from each other. The method has been disclosed in Japanese Patent Application No. 6-162452. Referring to FIG. 10, reference numeral 100 represents a semiconductor film, 120 represents a separation layer, 140 represents a substrate, and 110 represents a through hole reaching to the separation layer 120. Reference numeral 130 represents etchant and 130B represents water.

A method of separating the semiconductor film and the substrate from each other will now be described. The substrate 140 is made of silicon and formed into, for example, a single crystal silicon wafer. The thickness of the single crystal silicon wafer is usually 625 $\mu$m in a case where the diameter of the wafer is 6 inches. A separation layer is provided which is made of a silicon oxide film formed by, for example, oxidizing the substrate 140 with heat or a silicon oxide film deposited by CVD or the like. The thickness of the separation layer is, for example, 1 $\mu$m. The semiconductor film 100 is a polycrystal silicon film deposited on the separation layer by the CVD or the like. The semiconductor film 100 may be a semiconductor film having an improved electric characteristic by enlarging the crystal particle size by zone melting recrystallization or by solid phase epitaxy.

As shown in FIG. 10A, a semiconductor apparatus having the foregoing structure is, initially, immersed in, for example, hydrofluoric acid etchant 130A to introduce the hydrofluoric acid etchant 130A through the through holes 110 so as to remove the separation layer 120 by etching. Then, the semiconductor apparatus is washed with water, and then the space between the semiconductor film 100 and the substrate 140 is replaced with water 130B, as shown in FIG. 10B. In this state, water 130B acts like an adhesive agent between the semiconductor film 100 and the substrate 140 to prevent easy separation of the semiconductor film 100 from the substrate 140. If water 130B between the semiconductor film 100 and the substrate 140 is removed by allowing the semiconductor apparatus to stand or by drying the same with heat, the bonding state established between the semiconductor film 100 and the substrate 140 prevents natural separation of the semiconductor film 100.

Accordingly, when horizontal force is applied to the semiconductor film 100 along the surface of the substrate 140 as indicated by an arrow shown in FIG. 10B in a state as shown in FIG. 10B where the substrate 140 is fixedly held, water 130B between the semiconductor film 100 and the substrate 140 serves as a lubricant which permits the semiconductor film 100 to slide on the substrate 140. As described above, the semiconductor film 100 is drawn out from the position above the substrate 140 so that the semiconductor film 100 is separated from the substrate 140 (see FIG. 10C). The above-mentioned method permits the semiconductor film 100 to be divided into sections each having a thickness of 10 $\mu$m and a size of 10 cm×10 cm.

FIG. 11 is a structural view showing a conventional manufacturing apparatus for embodying the method of manufacturing the semiconductor apparatus. Similarly to the foregoing method, the apparatus has been disclosed in Japanese Patent Application No. 6-162452. Referring to FIG. 11, reference numeral 100 represents a semiconductor film, 110 represents a through hole, 140 represents a substrate, 210 represents a first container and 211 represents an upper portion of the first container 210. Reference numeral 212 represents a taper of the first container 210. Reference numeral 213 represents a lower portion of the first container 210. Reference numeral 300 represents an upper room, 310 represents a lower room, 400 represents a second container and 410 represents a cover for sealing up the second container 400.

In a case where the semiconductor film 100 is larger than the substrate 140 as shown in FIG. 11, the width of the lower room 310 is made to be smaller than the width of the upper room 300 so that introduction of the semiconductor film 100 is permitted and that of the substrate 140 is inhibited. Since force for fixing the semiconductor film 100 to the substrate 140 is lost after the separation layer has been removed by etching, the semiconductor film 100 is, attributable to the gravity, moved along the surface of the substrate 140 toward the lower room 310. Since the substrate 140 has a size with which the movement of the substrate 140 into the lower room 310 is inhibited, only the semiconductor film 100 is moved into the lower room 310. As a result, the separation of the semiconductor film 100 from the substrate 140 can be performed.

Since the conventional method and apparatus for manufacturing a semiconductor apparatus have been structured as described above, completion of the process for etching the separation layer does not result in the semiconductor film and the substrate being completely separated from each other. Since the semiconductor film and the substrate are, in many cases, in close contact with each other, an external force has been required to be applied to completely separate the semiconductor film and the substrate from each other. There arises another problem in that time required to complete the process cannot be shortened and the surface of the semiconductor film is roughened excessively because the semiconductor film is immersed in the etchant for a long time. Since the conventional manufacturing apparatus is not provided with a function for again liquefying vapor of the hydrofluoric acid etchant, there arise problems in that the life of the etchant is unsatisfactorily short and that an excessively large quantity of the etchant is required.

As a result, the cost performance has been unsatisfactory in a case where the semiconductor film and the substrate are separated from each other in the mass production level.

SUMMARY OF THE INVENTION

In view of the foregoing, a first object of the present invention is to provide a method and an apparatus for manufacturing a semiconductor apparatus capable of smoothly separating a semiconductor film and a substrate from each other.

Further, a second object of the present invention is to provide a method and an apparatus for shortening time required to complete the process.

Furthermore, a third object of the present invention is to provide a method and an apparatus for reducing consumption of etchant and thus exhibiting excellent cost performance.

According to one aspect of the present invention, there is provided a method of manufacturing a semiconductor apparatus having a process in which etchant is introduced into through holes formed in a semiconductor film formed on a substrate through a separation layer to remove the separation layer by etching so as to separate the substrate and the semiconductor film from each other, the method of manufacturing a semiconductor apparatus comprising the step of: etching the separation layer by using etchant to which an additive for improving an etching rate is added.

The separation layer may be made of a silicon oxide film. The semiconductor film may be made of silicon.

The concentration of p-type impurity contained in the substrate may be 1E17 $cm^{-3}$ or lower.

The surface of the semiconductor film separated from the substrate may be etched by 0.1 $\mu$m to 4.0 $\mu$m.

Hydrofluoric acid solution may be employed as the etchant for etching the separation layer. Ammonium fluoride may be employed as the additive.

Another additive which reacts with the etchant and forms bubbles may be added during or after removal of the separation layer so that the semiconductor film and the substrate are separated from each other. Carbonate or bicarbonate may be employed as the additive.

A hydrocarbon surface active agent may be added to the etchant for etching the separation layer during or after removal of the separation layer so that the semiconductor film and the substrate are separated from each other.

Surfaces of the semiconductor film and the substrate may be etched after the separation layer has been removed so that the semiconductor film and the substrate are separated from each other. Alkali or mixed acid etchant may be employed to etch the semiconductor film and the substrate. The separation layer may be etched in a state where the semiconductor film and the substrate may be mechanically secured.

The thickness of the semiconductor film of 100 $\mu$m or smaller can be separated from the substrate according to the present invention.

According to a second aspect of the present invention, there is provided an apparatus for manufacturing a semiconductor apparatus for separating a semiconductor film formed on a substrate through a separation layer from the substrate, the apparatus for manufacturing a semiconductor apparatus comprising: a first room having a size capable of accommodating the substrate to which the semiconductor film has been allowed to adhere; a second room having a size capable of accommodating the semiconductor film; and a stepped portion formed by tapering between the first room and the second room, wherein gravity is used to introduce the semiconductor film having an area smaller than that of the substrate into the second room from the first room during a process for separating the substrate and the semiconductor film from each other, the process being performed after the separation layer has been etched.

According to a third aspect of the present invention, there is provided an apparatus for manufacturing a semiconductor apparatus for separating a semiconductor film formed on a substrate through a separation layer from the substrate, the apparatus for manufacturing a semiconductor apparatus comprising: a first room having a size capable of accommodating the substrate to which the semiconductor film has been allowed to adhere; a second room having a size capable of accommodating the semiconductor film; and a stepped portion formed by tapering between the first room and the second room, wherein the shape of the taper of the stepped portion is a convex curve formed upwards against gravity and has a curvature radius which is twice or larger than the radius of the substrate.

According to a fourth aspect of the present invention, there is provided an apparatus for manufacturing a semiconductor apparatus comprising: a first container for accommodating etchant for etching a separation layer and a semiconductor film formed on a substrate through the separation layer; a second sealed container for accommodating the first container; and a re-liquefying unit for again liquefying vapor of the etchant generated in the second sealed container so as to again use re-liquefied vapor as the etchant.

A waste etchant treatment portion using acid or alkali solution may be provided for a discharge pipe for discharging, from the container accommodating the etchant, waste etchant generated during etching of the separation layer.

Other objects, features and advantages of the invention will be evident from the following detailed description of the preferred embodiments described in conjunction with the attached drawings.

DETAILED DESCRIPTION OF THE PREFERRED EMBODIMENTS

Embodiment 1

Figure 1:
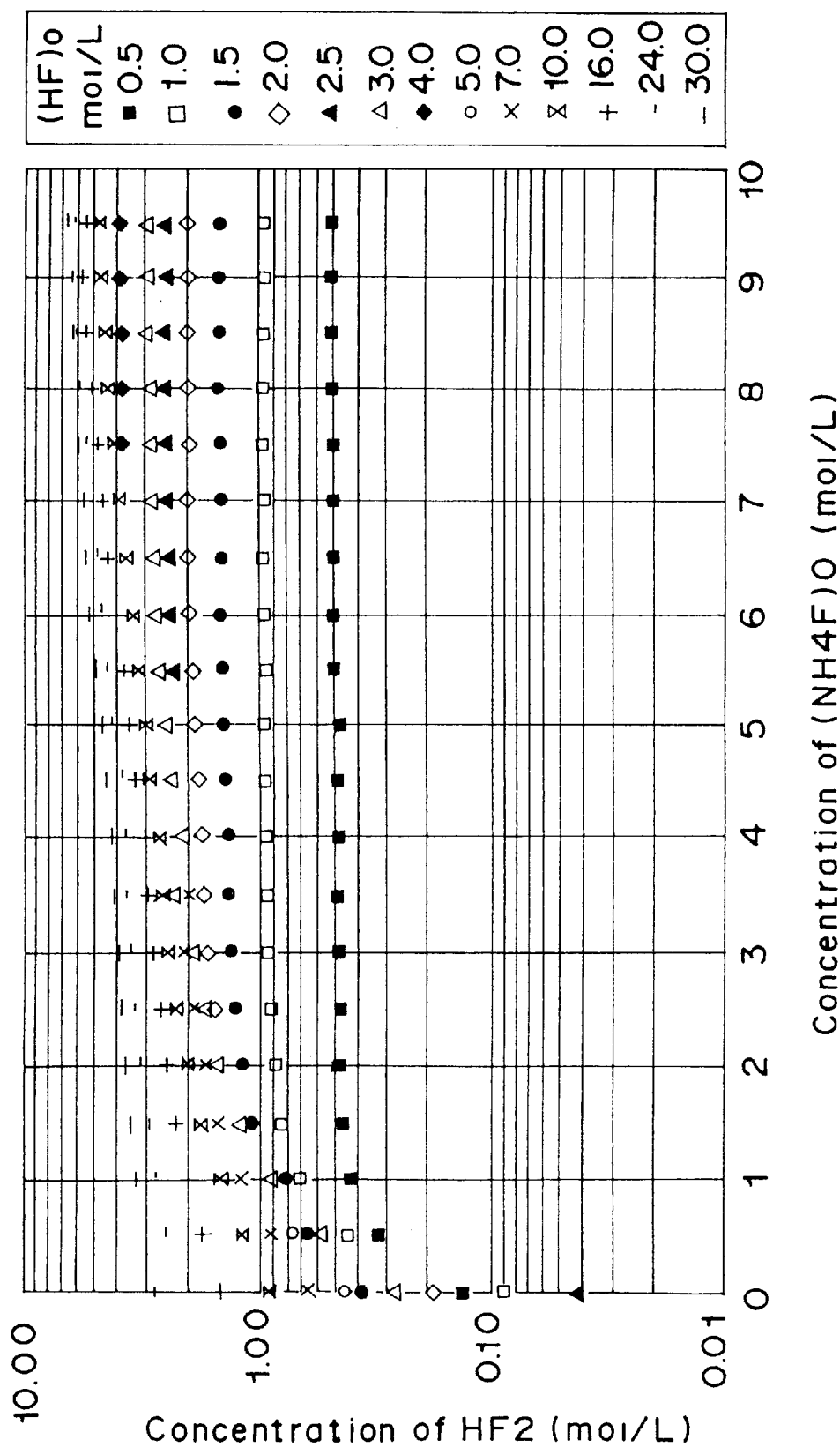
FIG. 1 is a diagram relating to a first embodiment of a method of manufacturing a semiconductor apparatus according to the present invention.

FIG. 1 is a diagram relating to a first embodiment of a method of manufacturing a semiconductor apparatus according to the present invention, in which dependency of the concentration of $HF_2^-$ ions upon the concentration of ammonium fluoride ($NH_4F$) is shown. A silicon oxide film ($SiO_2$) forming a separation layer reacts with $HF_2^-$ ions so that $H_2SiF_6$ and water $H_2O$ are generated. Therefore, the etching rate of the silicon oxide film can be improved by raising the concentration of $HF_2^-$ ions in the hydrofluoric acid solution. In FIG. 1, there will now be considered a case that 6 mol/litter ammonium fluoride is added to 24 mol/liter hydrofluoric acid. In a case where no ammonium fluoride is contained (in a state at the left-hand end of the graph), the concentration of the $HF_2^-$ ions is about 2.0 mol/liter. When 6 mol/liter ammonium fluoride is added, the concentration of the $HF_2^-$ ions is raised to about 4.5 mol/liter. Another case will now be considered where 5 mol/liter to 6 mol/liter ammonium fluoride is added to 38% hydrofluoric acid. Since 38% hydrofluoric acid is about 19 mol/liter, a trend between a plot of 16 mol/liter and that of 24 mol/liter is shown. It can be understood that addition of 5 mol/liter to 6 mol/liter ammonium fluoride results in the concentration of $HF_2^-$ ions being raised to two to three times. Addition of ammonium fluoride to the hydrofluoric acid solution enables the concentration of the $HF_2^-$ ions in the hydrofluoric acid solution to be raised, resulting in an increased etching rate of the silicon oxide film.

In a preferred embodiment, ammonium fluoride of 2 to 7 mol/L may be added to the hydrofluoric acid solution of 2 mol/L or more. Even if more than 7 mol/L of ammonium fluoride is added to the hydrofluoric acid solution, no more increase in the concentration of $HF_2^-$ ions and thus no more increase in the etching rate can be obtained.

Figure 10A:
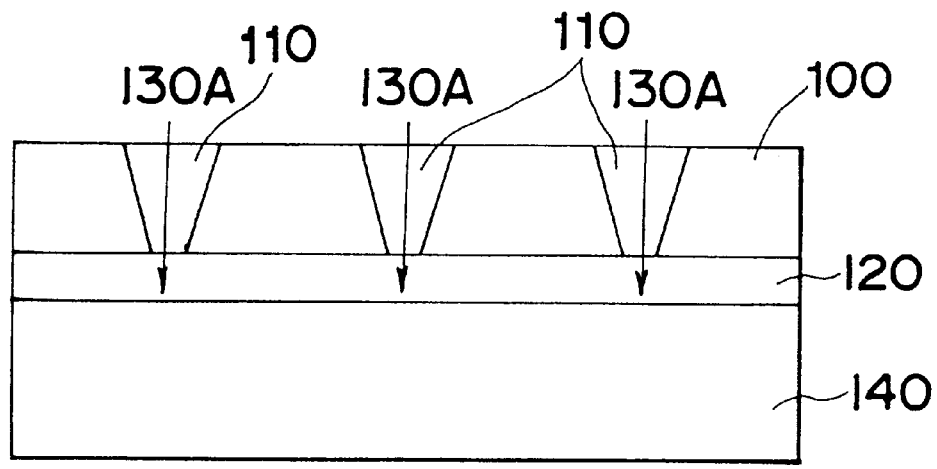
FIGS. 10A, 10B and 10C are schematic views showing a conventional method of manufacturing a semiconductor apparatus.
Figure 10B:
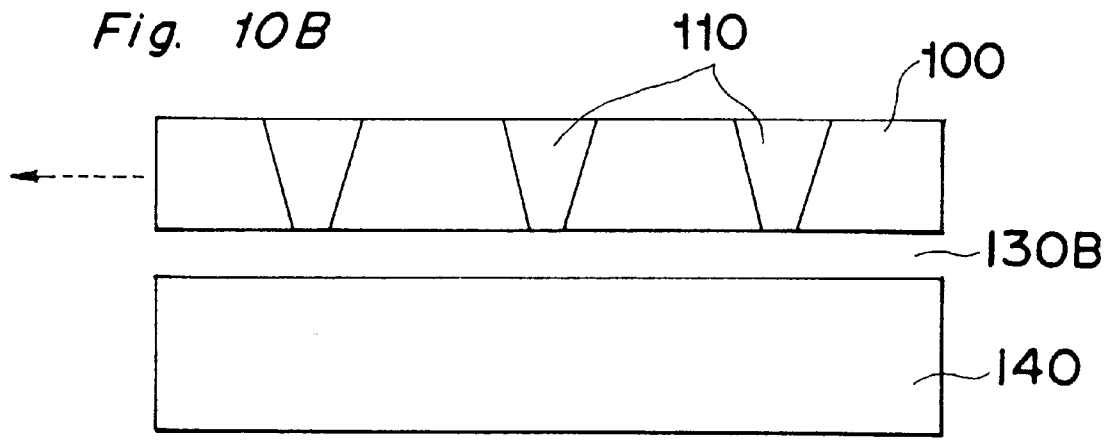
Figure 10C:
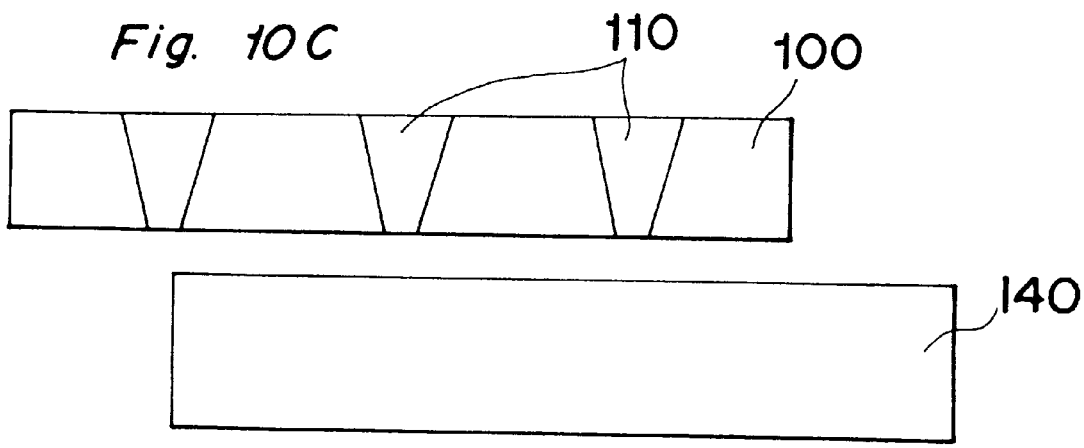
Figure 11:
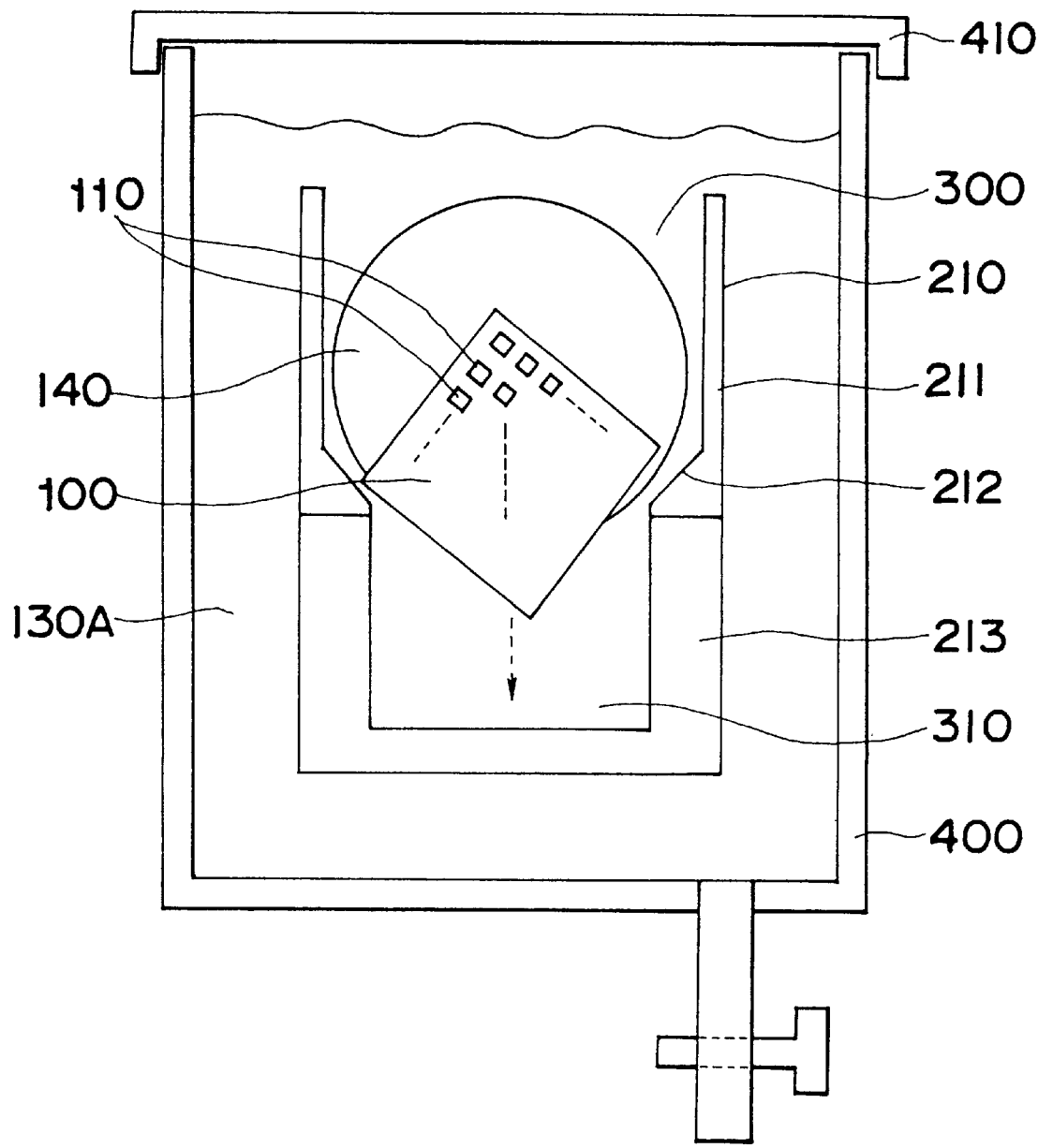
FIG. 11 is a structural view showing the conventional apparatus of manufacturing a semiconductor apparatus.

As described above, when the method according to the first embodiment of the present invention is adapted to the conventional method of separating the semiconductor film and the substrate from each other shown in FIGS. 10 and 11, the semiconductor film and the substrate can smoothly be separated from each other.

Embodiment 2

Figure 2:
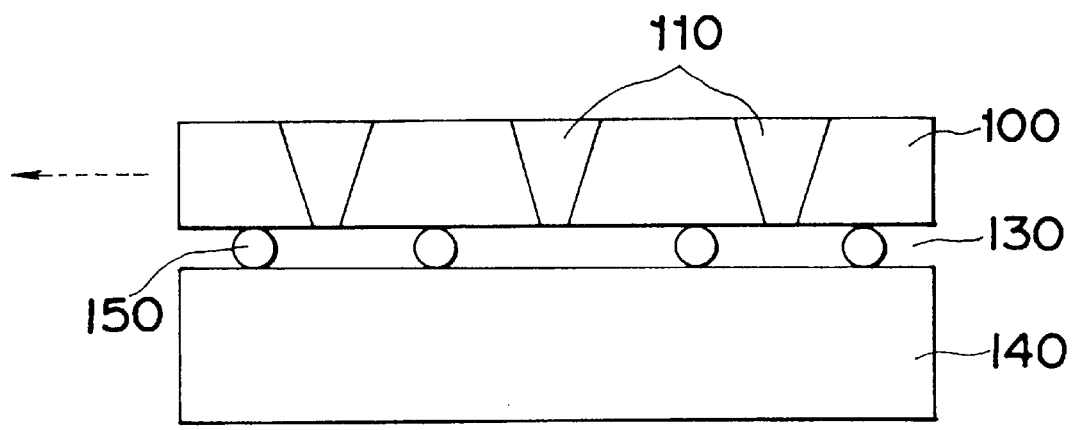
FIG. 2 is a schematic view showing a second embodiment of the method of manufacturing a semiconductor apparatus according to the present invention.

FIG. 2 is a schematic view showing a second embodiment of the method of manufacturing a semiconductor apparatus according to the present invention. Referring to FIG. 2, reference numeral 100 represents a semiconductor film, 110 represents a through hole, 120 represents a separation layer, 130 represents etchant and 140 represents a substrate, similarly to the conventional structure. Reference numeral 150 represents $CO_2$ which is formed into bubbles due to reactions between hydrofluoric acid, which is an etchant for the separation layer and used in an aqueous solution, and carbonate or bicarbonate, which is typically an additive in a powder form.

In many cases, the semiconductor film and the substrate are in close contact with each other and thus complete separation cannot be realized even after etching of the separation layer has been completed. Therefore, any external force is required to completely separate the semiconductor film and the substrate from each other. In the case shown in FIG. 2, an additive, for example, $NaHCO_3$, which allows to occur a bubble forming reaction with hydrofluoric acid serving as the etchant for the separation layer, is added to allow hydrofluoric acid and the additive between the semiconductor film and the substrate to react with each other to cause $CO_2$ to form bubbles and can be added to the etchant as long as it does not lower the etching rate. As a result, the gap between the semiconductor film and the substrate can be enlarged so that the semiconductor film and the substrate are completely separated from each other.

As described above, according to the above-mentioned second embodiment, the semiconductor film and the substrate can be separated further reliably as compared with the first embodiment.

Embodiment 3

Figure 3:
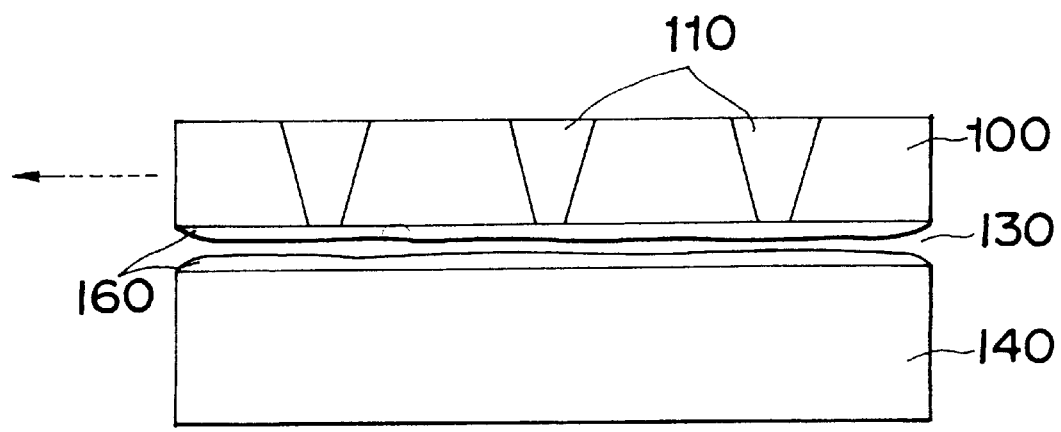
FIG. 3 is a schematic view showing a third embodiment of the method of manufacturing a semiconductor apparatus according to the present invention.

FIG. 3 is a schematic view showing a third embodiment of the method of manufacturing a semiconductor apparatus according to the present invention. Referring to FIG. 3, reference numeral 160 represents a state where the wettability has been improved. Note that the same or similar elements to those according to the second embodiment are given the same reference numerals and the same or similar elements are omitted from description.

Referring to FIG. 3, a hydrocarbon surface active agent such as alkylbenzene sodium sulfonate is directly added to the etchant for the separation layer or added after the process for etching the separation layer and a water washing process have been completed so that the solution is easily introduced into the gap between the semiconductor film and the substrate. As a result, the gap can be enlarged to completely separate the semiconductor film and the substrate from each other. As a result, an effect similar to that obtainable from the second embodiment can be obtained. Although the angle of contact denoting free energy of the solid-liquid interface is usually about 70 degrees, addition of the surface active agent lowers it to about 30 degrees, resulting in realization of a completely wet state. The surface active agent may be added as long as it does not lower the etching rate of HF.

Embodiment 4

Figure 4:
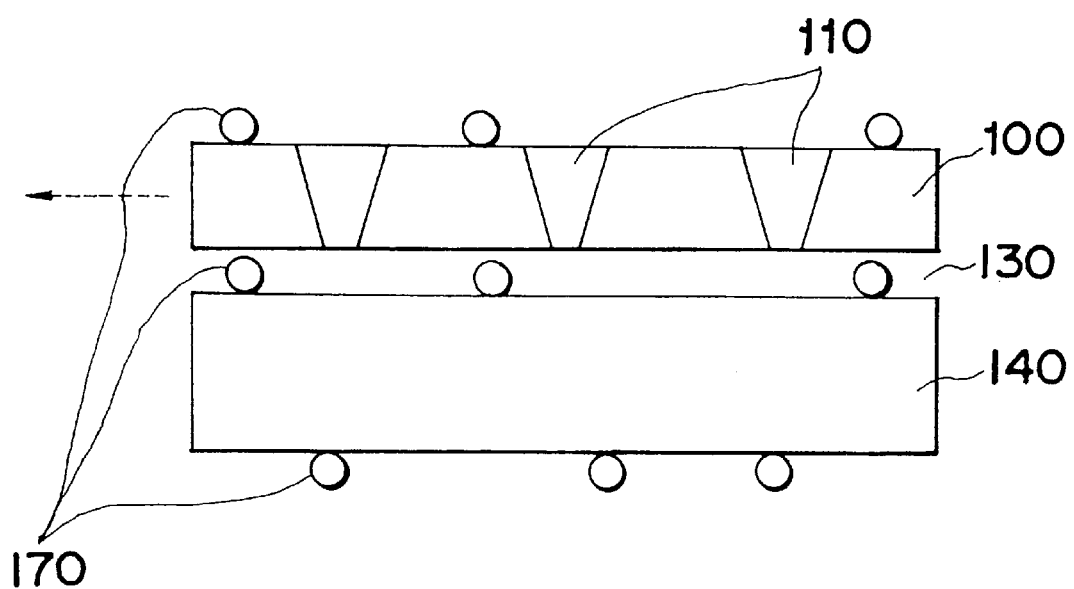
FIG. 4 is a schematic view showing a fourth embodiment of the method of manufacturing a semiconductor apparatus according to the present invention.

FIG. 4 is a schematic view showing a fourth embodiment of a method of manufacturing a semiconductor apparatus according to the present invention. Referring to FIG. 4, reference numeral 170 represents bubbles formed when the semiconductor film and the substrate are etched. Note that the same or similar elements to those according to the second embodiment are given the same reference numeral and the same or the similar elements are omitted from description.

When the semiconductor film and the substrate have been etched after etching of the separation layer and water washing have been performed, bubbles 170 are formed, as shown in FIG. 4. Bubbles 170 expand the gap between the semiconductor film and the substrate so that they are completely separated from each other. As a result, an effect similar to that obtainable from the second embodiment can be obtained. The etchant for etching the semiconductor film and the substrate may be alkali solution of potassium hydroxide or sodium hydroxide; or mixed acid of hydrofluoric acid and nitric acid; or mixed acid obtained by adding at least any one of acetic acid, phosphoric acid, sulfuric acid or hydrogen peroxide solution to the mixed acid of hydrofluoric acid and nitric acid. As a result, nitric oxide or the like is caused to form bubbles.

In case of using KOH solution as the alkali solution, an aqueous solution containing 20 wt % of KOH is heated to 80° C., where the etching rate for silicon is 1.2 $\mu$m/min. while there is generated a hydrogen gas to promote separation between the semiconductor film and the substrate.

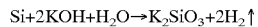
$$Si+2KOH+H_2O \rightarrow K_2SiO_3+2H_2\uparrow$$

In case of using the mixed acid of HF and $HNO_3$, one part of 50% hydrofluoric acid and nine parts of 69% nitric acid are mixed together, where the etching rate for silicon is 3.0 $\mu$m/min. at a solution temperature of 40° C. while there is generated a nitrogen oxide gas to promote separation between the semiconductor film and the substrate.

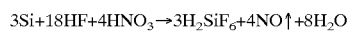
$$3Si+18HF+4HNO_3 \rightarrow 3H_2SiF_6+4NO\uparrow+8H_2O$$

Embodiment 5

Figure 5A:
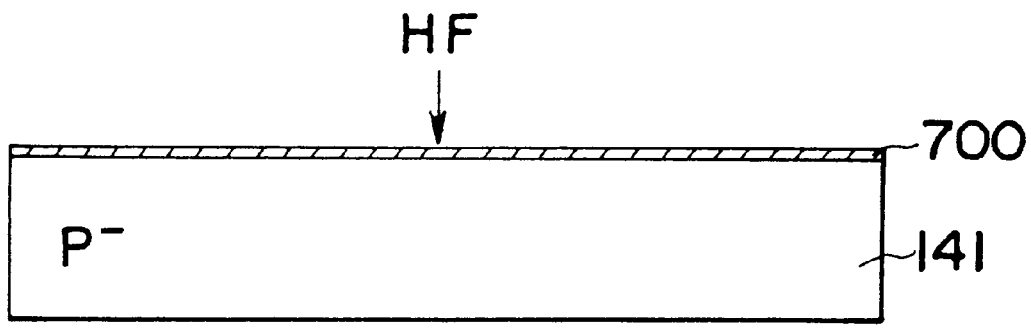
FIGS. 5A, 5B, 5C and 5D are schematic views showing a fifth embodiment of the method of manufacturing a semiconductor apparatus according to the present invention.
Figure 5B:
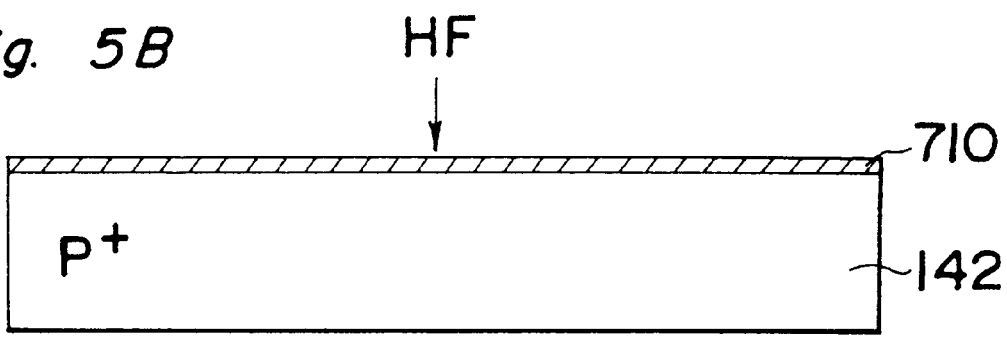
Figure 5C:
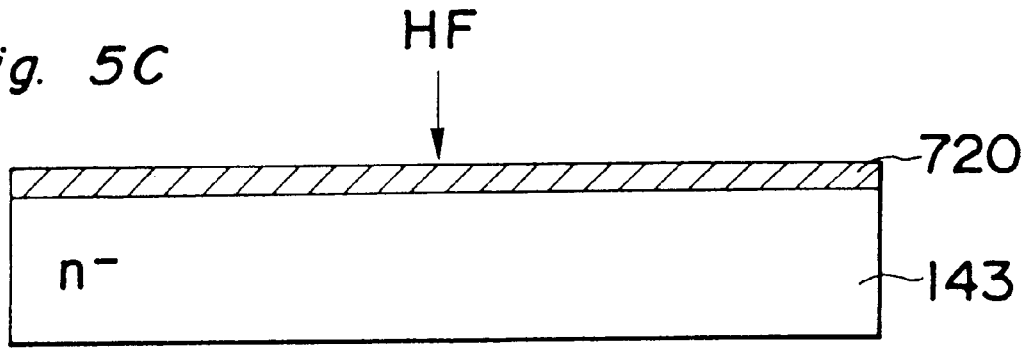
Figure 5D:
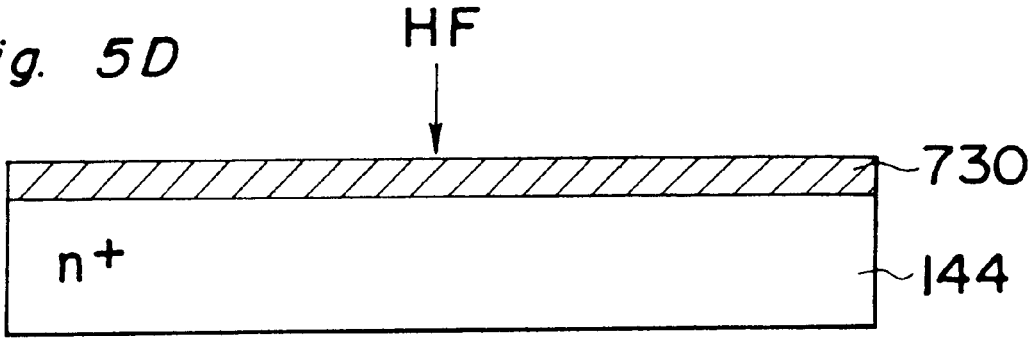

FIGS. 5A to 5D are schematic views showing a fifth embodiment of the method of manufacturing a semiconductor apparatus according to the present invention. The materials of the substrate are single crystal silicon materials. Reference numeral 141 represents a $p^-$ substrate in FIG. 5A, 142 represents a p$^+$ substrate in FIG. 5B, 143 represents a n$^-$ substrate in FIG. 5C, 144 represents a n$^+$ substrate in FIG. 5D, 700 represents a damage inflicted on the p$^-$ substrate in FIG. 5A, 710 represents a damage inflicted on the p$^+$ substrate in FIG. 5B, 720 represents a damage inflicted on the n substrate in FIG. 5C, and 730 represents a damage inflicted on the n$^+$ substrate in FIG. 5D. Definitions are made such that the p$^-$ substrate is a substrate containing p-type impurities by a concentration of 1E17 cm$^{-3}$ or lower, the p$^+$ substrate is a substrate containing p type impurities by a concentration of 1E18 cm$^{-3}$ or higher, the n$^-$ substrate is a substrate containing n type impurities by a concentration of 1E17 cm$^{-3}$ or lower, and the n$^+$ substrate is a substrate containing n type impurities by a concentration of 1E18 cm$^{-3}$ or higher. When the four types of silicon substrates were immersed in 50% hydrofluoric acid for about 8 hours, a result was obtained such that the degrees of the damages were in the descending order as the n$^+$ substrate, the n$^-$ substrate, the p$^+$ substrate and the p$^-$ substrate. The "damage" means deterioration of the surface of the single crystal silicon substrate such that it is formed into a porous shape after the single crystal silicon substrate has been immersed in the hydrofluoric acid solution for a long time. In particular, the surfaces of the n$^+$ substrate, the n$^-$ substrate and the p$^+$ substrate are damaged considerably. If the thin films of the foregoing types are adapted to a power generating layer of a solar cell such that patterning of a region having a width of tens of $\mu$m is performed during the process for forming electrodes which is performed after the thin film has been separated, the patterning operation cannot satisfactorily be performed due to excessive surface damage. On the other hand, since the p$^-$ substrate according to this embodiment cannot be considerably damaged, patterning can be performed satisfactorily. Therefore, it can be understood that a satisfactory effect can be obtained if silicon, in which the concentration of impurities, such as boron, is controlled to 1E17 cm$^{-3}$ or lower, is employed in a case where silicon is employed to form the substrate and the semiconductor film.

As described above, according to the fifth embodiment, a semiconductor apparatus can be obtained which comprises the semiconductor film and substrate having the surfaces which can satisfactorily be protected from being damaged, and patterning of which can satisfactorily be performed.

Embodiment 6

In this embodiment, a method of removing the damaged layer described in the fifth embodiment will now be described. That is, a semiconductor film having the surface which has been damaged by the etchant for the separation layer is etched by a depth of 0.1 $\mu$m to 4.0 $\mu$m, and then subjected to following processes. In this case, for example, 20% and 80° C. potassium hydroxide solution is employed as the etchant for etching the damaged layers. If the thickness of the damaged layer is about 0.05 $\mu$m, etching can be completed in about 0.1 minute to 3 minutes.

Embodiment 7

Figure 6A:
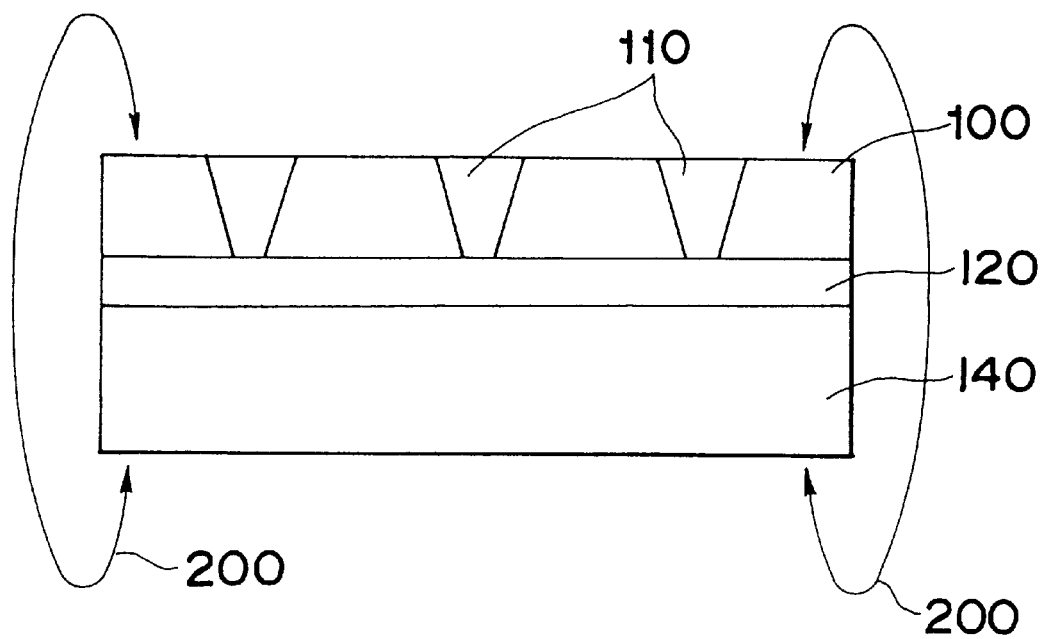
FIGS. 6A, 6B and 6C are schematic views showing an apparatus for manufacturing a semiconductor apparatus according to a seventh embodiment of the present invention.
Figure 6B:
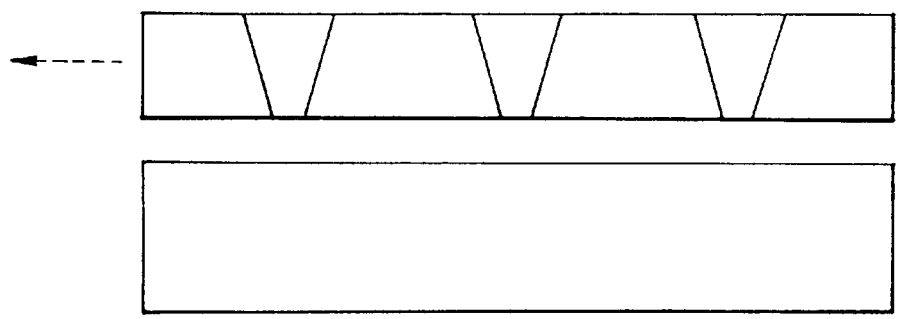
Figure 6C:
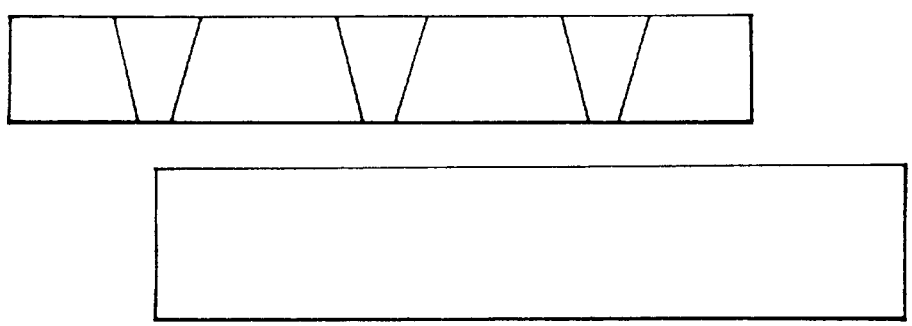

FIGS. 6A to 6C are schematic views showing a seventh embodiment of an apparatus for manufacturing a semiconductor apparatus according to the present invention. Referring to FIGS. 6A to 6C, reference numeral 200 represents a jig for securing a semiconductor film and a substrate in the direction of the thickness of the semiconductor apparatus. As the separation layer is etched, the area of contact between each of the semiconductor film and the substrate and the separation layer is reduced. As a result, small external force, such as swing, bubbling, or the internal stress of the semiconductor film, sometimes damages the semiconductor film or the substrate during the process for etching of the separation layer, in particular, immediately before completion of the etching process if the residual area of the separation layer is 1 mm$^2$ or smaller. When the semiconductor film and the substrate are secured with a pressure of 1 kgf/cm$^2$ applied in the direction of the thickness of each of the semiconductor film and the substrate, the semiconductor film and the substrate can be separated from each other without damage during the process for etching the separation layer.

As described above, according to the seventh embodiment, the semiconductor film and the substrate can be protected from being damaged during the etching process, and the semiconductor film and the substrate can smoothly be separated from each other.

Embodiment 8

Figure 7:
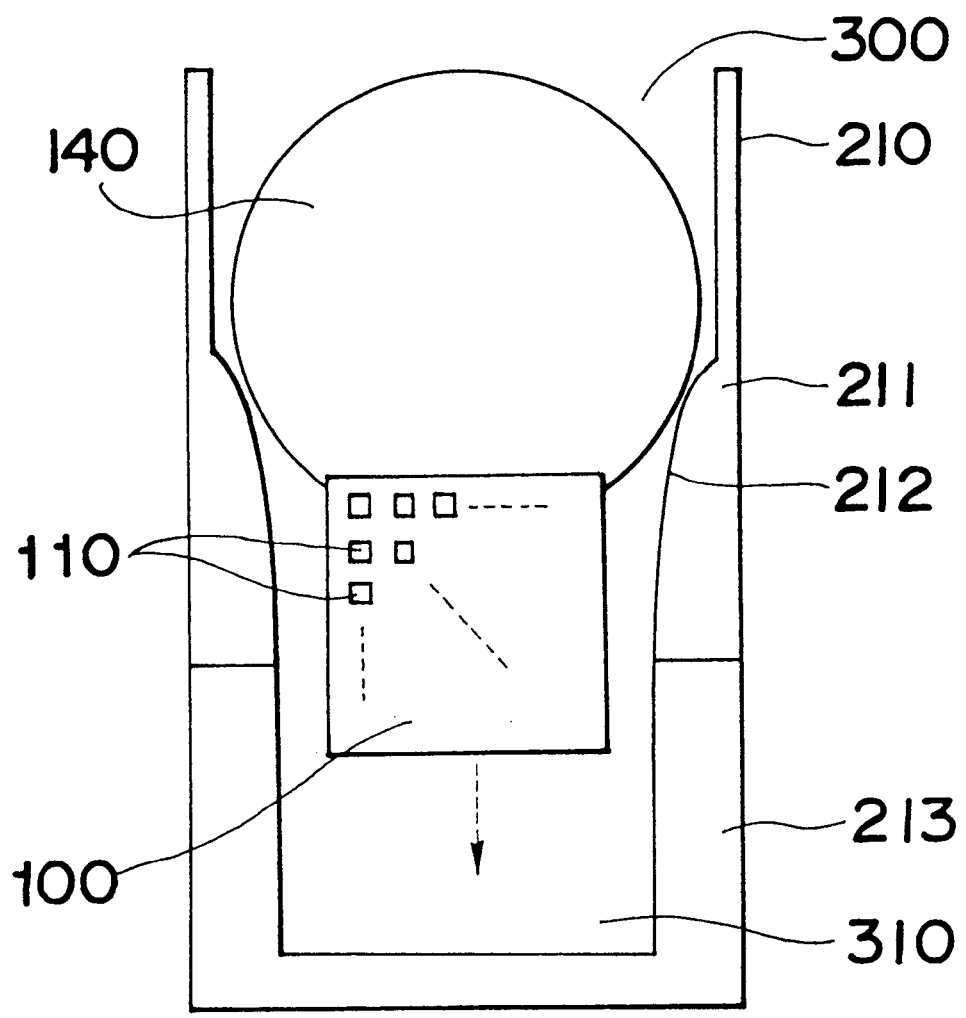
FIG. 7 is a schematic view showing an apparatus for manufacturing a semiconductor apparatus according to an eighth embodiment of the present invention.

FIG. 7 is a schematic view showing an eighth embodiment of the apparatus for manufacturing a semiconductor apparatus according to the present invention. Referring to FIG. 7, reference numeral 100 represents a semiconductor film and 110 represents a through hole formed in the semiconductor film 100. Reference numeral 140 represents a substrate, 210 represents a first container, 211 represents an upper portion of the first container 210. Reference numeral 212 represents a taper provided for the first container 210. Reference numeral 213 represents a lower portion of the first container 210. Reference numeral 300 represents an upper room and 310 represents a lower room. This embodiment is different from the conventional example mainly in the shape of the taper 212. The operation of this embodiment will now be described. In a case where the semiconductor film 100 is smaller than the substrate 140 as shown in FIG. 7, the width of the lower room 310 is arranged to be smaller than the width of the upper room 300 so that introduction of the semiconductor film 100 is permitted and that of the substrate 140 is inhibited. Since the force for fixing the semiconductor film 100 to the substrate 140 is lost after the separation layer has been removed by etching, the semiconductor film 100 is, attributable to the gravity, moved along the surface of the substrate 140 toward the lower room 310. Since the substrate 140 has a size with which the movement of the substrate 140 into the lower room 310 is inhibited, only the semiconductor film 100 is moved into the lower room 310. As a result, the separation of the semiconductor film 100 from the substrate 140 can be performed, similarly to the conventional example. The taper, provided to establish the connection between the upper room 300 and the lower room 310 and formed into a straight shape in the conventional example, is formed into a curved shape in this embodiment. It was confirmed that the preferred shape of the taper is a convex curve formed upwards against the gravity and has a curvature radius which is twice or larger the radius of the substrate.

As described above, according to the eighth embodiment, an apparatus can be obtained which is capable of optimally separating the semiconductor film and the substrate from each other in the first to fourth embodiments.

Embodiment 9

Figure 8:
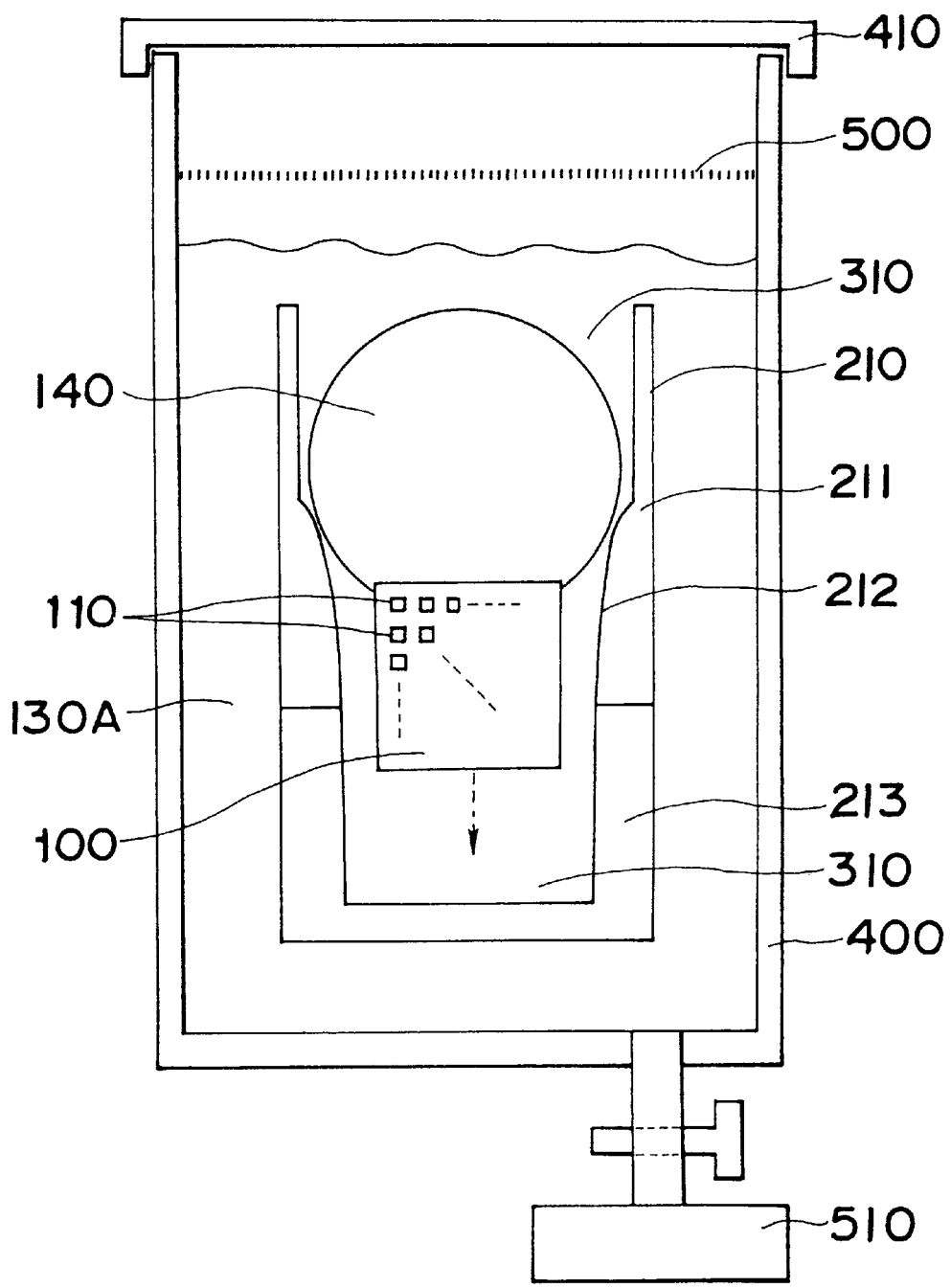
FIG. 8 is a schematic view showing an apparatus for manufacturing a semiconductor apparatus according to a ninth embodiment of the present invention.
Figure 9:
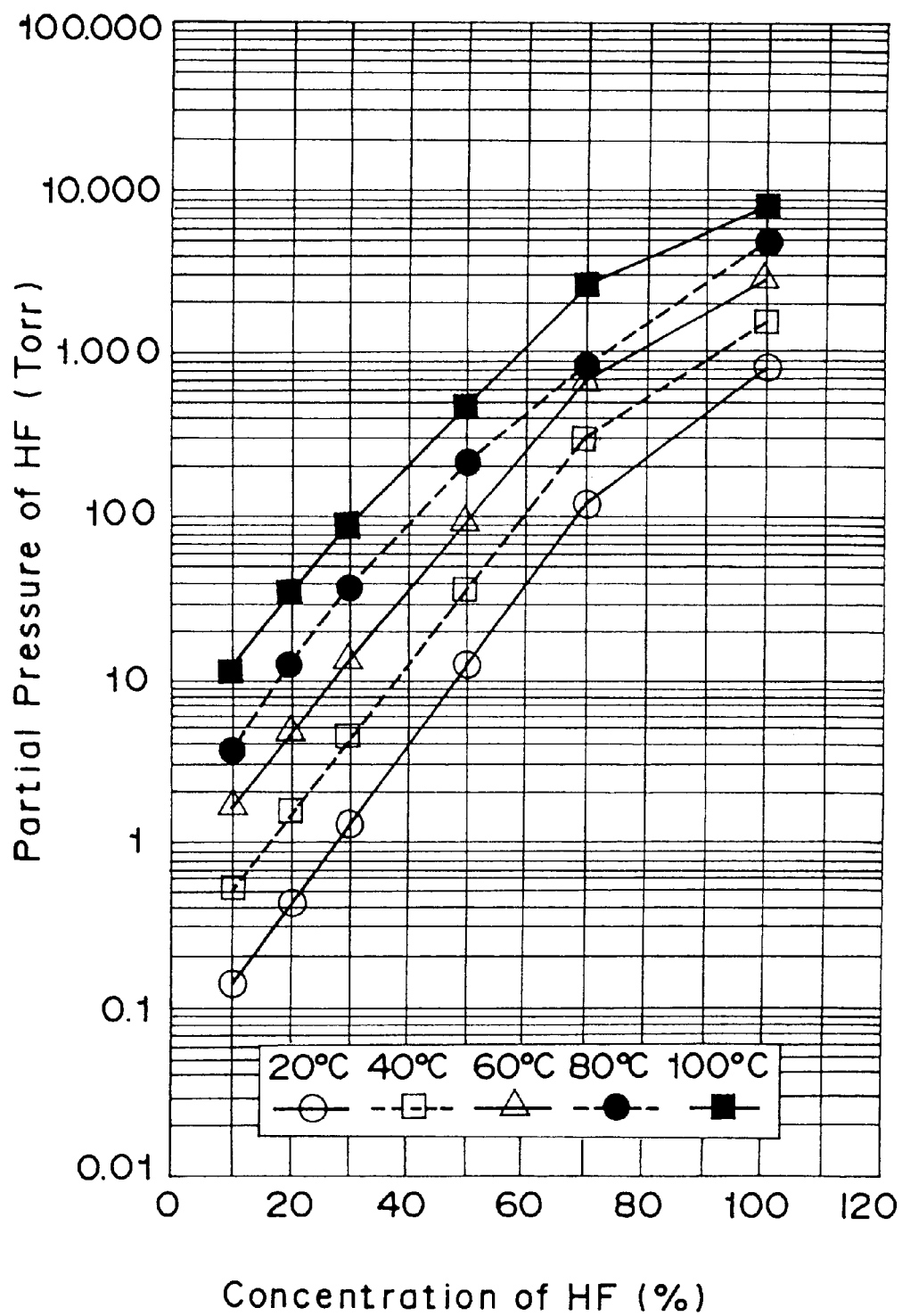
FIG. 9 is a schematic view showing an apparatus for manufacturing a semiconductor apparatus according to the ninth embodiment of the present invention.

FIG. 8 is a structural view showing an apparatus for manufacturing a semiconductor apparatus according to a ninth embodiment of the present invention. Referring to FIG. 8, reference numeral 500 represents a function for again liquefying vapor of the etchant, and 510 represents a waste etchant treatment portion. The same or similar elements to those of the conventional example are given the same reference numerals and the same or similar elements are omitted from description. FIG. 9 is a graph showing the relationship between the concentration of hydrofluoric acid and the vapor pressure of the hydrofluoric acid.

Hydrofluoric acid solution for use as the etchant for the separation layer has vapor pressure of tens of Torr even if the temperature is about 40° C. in a case where the temperature of, for example, 50% hydrofluoric acid has been raised as shown in FIG. 9 (note that the vapor pressure of $H_2O$ at 100° C., that is, the vapor pressure when water is boiled is 760 Torr). Accordingly, as shown in FIG. 8, for example, a cooling coil is, as the function 500 for again liquefying vapor, disposed above the liquid level of the etchant, and the second container is formed into a sealed type to again liquefying vapor of hydrofluoric acid with a satisfactory efficiency. The solution again liquefied is again used as the etchant so as to save the etchant.

Moreover, the foregoing manufacturing apparatus is provided with a waste etchant treatment portion 510 for treating waste etchant, as shown in FIG. 8. Since the waste etchant discharged from the apparatus for manufacturing a semiconductor apparatus contains dust generated from the ends of the semiconductor film or ends of the substrate during the process for etching the separation layer, the waste etchant treatment portion 510 is provided for the etchant discharge pipe for disposing the etchant, the waste etchant treatment portion 510 accommodating acid or alkali which is capable of dissolving the dust. As a result, the waste etchant is neutralized and made to be harmless before the waste etchant is discharged to the outside of the apparatus. In a case where silicon is used to form the substrate and the semiconductor film, fluoronitric acid solution or potassium hydroxide solution is employed as the waster etchant treatment agent.

As described above, according to the ninth embodiment, an apparatus for manufacturing a semiconductor apparatus can be obtained which is capable of reducing the amount of etchant consumption and the manufacturing cost. Moreover, clogging of the waste etchant discharge pipe caused from dust generated during the etching process can be prevented, and the waste etchant can be neutralized and made to be harmless so that a safety apparatus for manufacturing a semiconductor apparatus is obtained.

Although the first to tenth embodiments have been described about the structure such that silicon is employed as the material of the semiconductor film 100 and the substrate 140 and a silicon oxide film is employed as the separation layer 120, GaAs may be employed in place of silicon and AlAs may be employed in place of the silicon oxide film in the case where the etchant is hydrofluoric acid to obtain an effect similar to that obtainable from the first to tenth embodiments.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A method of manufacturing a semiconductor apparatus comprising the steps of:
   forming a separation layer and a semiconductor film having through holes on a substrate;
   removing the separation layer by introducing an etchant into said through holes and etching the separation layer; and
   separating the semiconductor film from the substrate,
   wherein an additive for improving the etching rate is introduced with the etchant and
   wherein a second additive selected from the group consisting of carbonates and bicarbonates is introduced with the etchant or a second additive selected from the group consisting of carbonates and bicarbonates is introduced after removal of the separation layer and gas bubbles are formed by a reaction between the etchant and the second additive.

2. A method of manufacturing a semiconductor apparatus according to claim 1, wherein the separation layer is made of a silicon oxide film.

3. A method of manufacturing a semiconductor apparatus according to claim 1, wherein the semiconductor film is made of silicon.

4. A method of manufacturing a semiconductor apparatus according to claim 3, wherein concentration of p-type impurity contained in the substrate is 1E17 $cm^{-3}$ or lower.

5. A method of manufacturing a semiconductor apparatus according to claim 1, which further comprises a step of etching the surface of the semiconductor film separated from the substrate by 0.1 µm to 4.0 µm.

6. A method of manufacturing a semiconductor apparatus according to claim 1, wherein hydrofluoric acid solution is employed as the etchant for etching the separation layer.

7. A method of manufacturing a semiconductor apparatus according to claim 6, wherein ammonium fluoride is employed as the additive.

8. A method of manufacturing a semiconductor apparatus according to claim 1, wherein a second additive which reacts with etchant and forms bubble and selected from the group consisting of carbonates and bicarbonates is added to the etchant during or after removal of the separation layer to enlarge the separation between the substrate and the semiconductor film.

9. A method of manufacturing a semiconductor apparatus according to claim 8, wherein the second additive comprises $NaHCO_3$.

10. A method of manufacturing a semiconductor apparatus according to claim 1, further comprises a step of etching a surface of the semiconductor film and the substrate after removal of the separation layer to enlarge the separation between the substrate and the semiconductor film.

11. A method of manufacturing a semiconductor apparatus according to claim 10, wherein alkali or mixed acid etchant is employed to etch the surfaces of the semiconductor film and the substrate after removal of the separation layer.

12. A method of manufacturing a semiconductor apparatus according to claim 1, wherein the step of etching the separation layer is carried out under a state where the semiconductor film and the substrate are mechanically secured.

13. A method of manufacturing a semiconductor apparatus according to claim 1, wherein the thickness of the semiconductor film is 100 µm or smaller.

14. A method for manufacturing a semiconductor apparatus according to claim 1, comprising steps of:
   providing a first room having a size capable of accommodating the substrate provided with the semiconductor film adhered thereon;
   providing a second room having a size capable of accommodating the semiconductor film; and
   providing a connection portion formed by tapering a connection width thereof between said first room and said second room in such a way that the semiconductor film but not the substrate can be passed therethrough into said second room from said first room due to a gravity action thereby separating the substrate and the semiconductor film from each other, after the separation layer has been etched.

15. A method of manufacturing a semiconductor apparatus according to claim 14, wherein a waste etchant treatment portion using acid or alkali solution is provided for a discharge pipe for discharging, from the container accommodating the etchant, waste etchant generated during etching of the separation layer.

16. A method of manufacturing a semiconductor apparatus according to claim 1, wherein the second additive is introduced after removal of the separation layer.

17. A method of manufacturing a semiconductor apparatus according to claim 11, wherein said alkali etchant is a solution comprising potassium hydroxide or sodium hydroxide.

18. A method of manufacturing a semiconductor apparatus according to claim 11, wherein said mixed acid etchant comprises hydrofluoric acid and nitric acid.

19. A method of manufacturing a semiconductor apparatus according to claim 16, wherein said mixed acid etchant further comprises at least one selected from the group consisting of acetic acid, phosphoric acid, sulfuric acid, and hydrogen peroxide.

20. A method of manufacturing a semiconductor apparatus according to claim 8, wherein said gas bubbles are selected from the group consisting of hydrogen gas and nitrogen oxide gas.

21. A method of manufacturing a semiconductor apparatus according to claim 14, wherein etchant vapor is formed from the etchant and said method comprises cooling to liquefy said etchant vapor.

* * * * *